(12) United States Patent
Wilson et al.

(10) Patent No.: US 11,997,782 B2
(45) Date of Patent: May 28, 2024

(54) THERMALLY CONDUCTIVE LABEL FOR CIRCUIT

(71) Applicant: Micron Technology, Inc., Boise, ID (US)

(72) Inventors: Kaleb A. Wilson, Caldwell, ID (US); Shams U Arifeen, Bellevue, WA (US); Bradley Russell Bitz, Meridian, ID (US); João Elmiro Da Rocha Chaves, Middleton, ID (US); Mark A. Tverdy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 17/459,102

(22) Filed: Aug. 27, 2021

(65) Prior Publication Data

US 2023/0065633 A1    Mar. 2, 2023

(51) Int. Cl.
*H05K 1/02*    (2006.01)

(52) U.S. Cl.
CPC . *H05K 1/0207* (2013.01); *H05K 2201/10159* (2013.01); *H05K 2201/10545* (2013.01)

(58) Field of Classification Search
CPC ......... H05K 1/02–0203; H05K 1/0207; H05K 1/0209–0212; H05K 1/11; H05K 1/181; H05K 7/20509; H05K 7/2039; H05K 7/20545; H05K 7/20445; H05K 7/209; H05K 7/20454; H05K 2201/056; H05K 2201/066; H05K 2201/10159; H05K 2201/1056; H05K 2201/10545; H01L 23/13; H01L 23/3121; H01L 23/32; H01L 23/3672; H01L 23/49811
See application file for complete search history.

(56) References Cited

U.S. PATENT DOCUMENTS

| | | | | |
|---|---|---|---|---|
| 5,109,318 A | * | 4/1992 | Funari | H05K 7/20509 257/713 |
| 6,157,538 A | * | 12/2000 | Ali | G06F 1/20 257/713 |
| 10,667,431 B1 | * | 5/2020 | Lunsman | H05K 7/20254 |
| 2007/0263359 A1 | * | 11/2007 | Lai | H01L 23/4093 257/E23.103 |
| 2009/0109613 A1 | * | 4/2009 | Legen | H01L 23/4093 361/709 |
| 2011/0286179 A1 | * | 11/2011 | Motschman | H01L 23/4093 361/679.54 |

(Continued)

OTHER PUBLICATIONS

"8810 Thermally Conductive Adhesive Transfer Tapes", [Online]. Retrieved from the Internet: URL: https: web.archive.org web 20200424010832 https: www.digikey.com en product-highlight 3 3m 8810-thermally-conductive-adhesive-transfer-tapes, (Apr. 24, 2020), 3 pgs.

*Primary Examiner* — Amir A Jalali
(74) *Attorney, Agent, or Firm* — Schwegman Lundberg & Woessner, P.A.

(57) ABSTRACT

Various embodiments described herein provide a label configured for thermal conductivity and configured to pass over an edge of a printed circuit board (PCB) and attached to both sides of the printed circuit board. The label can be used with a printed circuit board that is associated with a memory sub-system, such as a memory module (e.g., solid state drive, SSD module).

17 Claims, 6 Drawing Sheets

(56) References Cited

U.S. PATENT DOCUMENTS

| | | | | |
|---|---|---|---|---|
| 2012/0103564 | A1* | 5/2012 | Ye | H01L 23/4093 |
| | | | | 165/67 |
| 2012/0234524 | A1* | 9/2012 | Fan | B32B 9/007 |
| | | | | 165/185 |
| 2014/0217575 | A1* | 8/2014 | Hung | H01L 23/473 |
| | | | | 257/713 |
| 2014/0306335 | A1* | 10/2014 | Mataya | H01L 23/3677 |
| | | | | 977/734 |
| 2019/0348341 | A1* | 11/2019 | Pax | H01L 25/50 |
| 2020/0371568 | A1* | 11/2020 | Xiong | H05K 7/20418 |
| 2021/0144840 | A1* | 5/2021 | Pax | H05K 1/117 |
| 2021/0367057 | A1* | 11/2021 | Yoo | H05K 1/0209 |

\* cited by examiner

US 11,997,782 B2

THERMALLY CONDUCTIVE LABEL FOR CIRCUIT

TECHNICAL FIELD

Embodiments of the disclosure relate generally to labels for circuits and, more specifically, to circuit labels configured for thermal conductivity, which can be used with a printed circuit board implementing a memory module.

BACKGROUND

A memory sub-system can be a storage device, a memory module, or a hybrid of a storage device and memory module. Typically, manufacturers apply various labels to a memory sub-system or one or more components thereof, where the labels attach to the memory sub-system (or a component) by way of an adhesive disposed on at least one side of the labels. Example labels can include those that have printed text regarding the memory sub-system (e.g., manufacturer name, model number, manufacture date, serial number, etc.) or those used for warranty purposes (e.g., broken label voids warranty). At times, the label used can include properties or characteristics that assist the label in resisting/withstanding high heat produced by the memory sub-system (or a component thereof) during operation.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
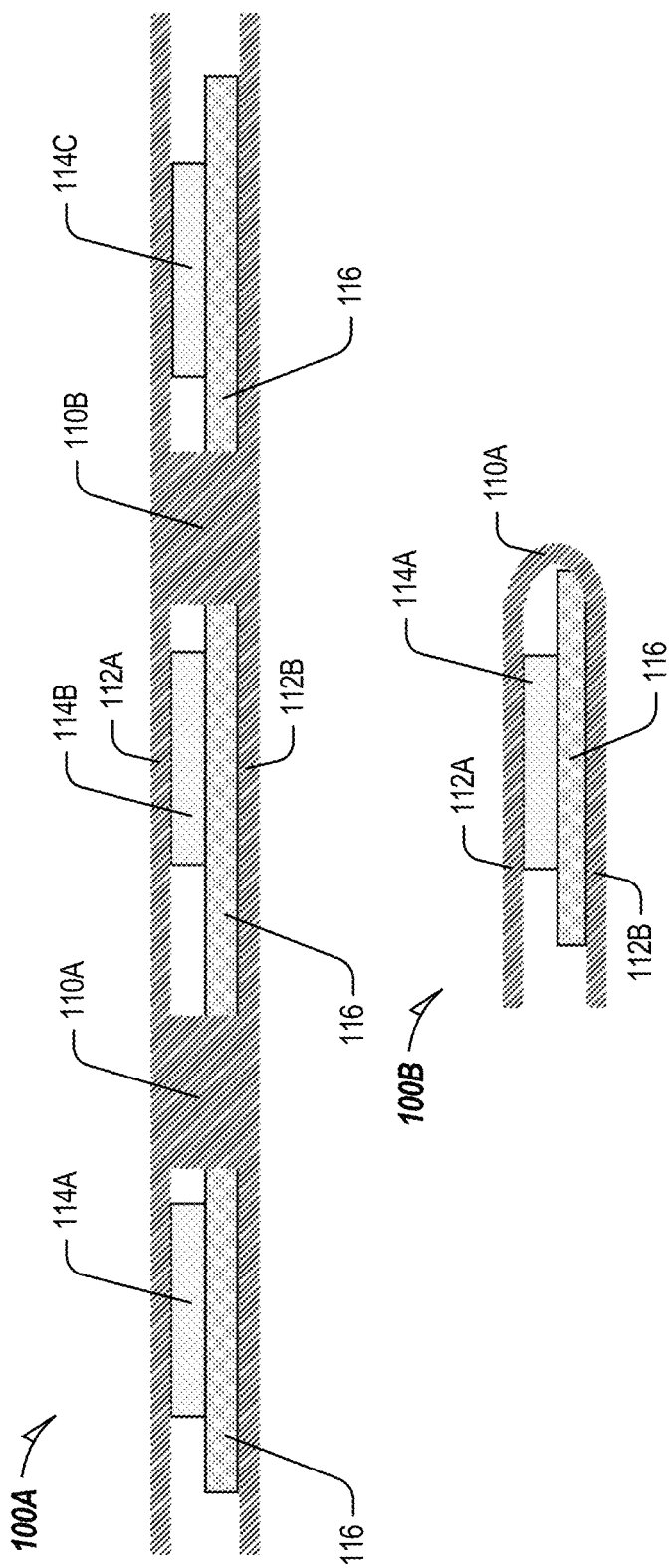
FIGS. 1 and 2 illustrate examples of thermally conductive labels attached to printed circuit boards (PCBs), in accordance with some embodiments of the present disclosure.

Aspects of the present disclosure are directed to circuit labels configured for thermal conductivity, which can be used with a printed circuit board (PCB) implementing a memory module of a memory sub-system. A memory sub-system can be a storage device, a memory module, or a hybrid of a storage device and memory module. In general, a host system can utilize a memory sub-system that includes one or more memory components (also hereinafter referred to as "memory devices"). The host system can provide data to be stored at the memory sub-system and can request data to be retrieved from the memory sub-system.

The components of printed circuit boards, such as those that implement a memory sub-system or a memory module (e.g., solid state drive (SSD) module, such as SSD M.2 memory module), typically generate heat during operation. PCBs are increasing in watts/density, which necessitate a method to remove heat quickly and ensure stable operating temperatures. Additionally, a reduction in system space is driving a need for thinner PCB solutions. At times, printed circuit boards have labels attached upon them that can be used for various purposes, such as listing information regarding the printed circuit boards or the systems they respectively implement, such as the manufacturer name, model number, manufacture date, or serial number. Conventional labels (e.g., conventional conductive labels) attached to PCBs usually have poor or limited thermal conductivity, which can hinder the cooling of a PCB (or its components) when the PCB is in use. As a result, conventional labels do not transfer enough heat from the source.

Aspects of the present disclosure address the deficiencies of conventional labels by describing circuit labels that provide improved thermal conductivity over conventional labels. In particular, various embodiments provide for a label that comprises a first planar portion configured to attach over a first side of a PCB, a second planar portion configured to attach over a second (opposite) side of the PCB, and multiple tab portions each of which connects the first planar portion to the second planar portion, where the first planar portion, the second planar portion, and each of the tab portions comprises a thermal conduction layer (e.g., shares a single continuous thermal conduction layer). Some embodiments provide for a label comprising: a first planar portion comprising a first thermal conduction layer; a first adhesive layer configured to attach the first planar portion to a PCB such that the first planar portion is disposed over a first side of the PCB; a second planar portion comprising a second thermal conduction layer; a second adhesive layer configured to attach the second planar portion to the PCB such that the second planar portion is disposed over a second side of the PCB; and a plurality of tab portions in which each tab portion connects the first planar portion to the second planar portion, each tab portion being configured to pass over (e.g., curve over or around) a single edge of the PCB, and each tab portion comprising a separate thermal conduction layer that connects the first thermal conduction layer to the second thermal conduction layer.

The label of some embodiments can provide thermal conductive paths with desirable (e.g., maximized) area from components of a PCB, while allowing for heat dissipation (e.g., air flow convection cooling).

As used herein, a label can include a piece (e.g., small piece) of physical material (e.g., metal, fabric, plastic, or some combination thereof) configured to attached to an object, such as a PCB. Generally, a label can provide information regarding the object (e.g., the PCB) to which it is attached. As used herein, a tab portion can include any small portion of a label that connects two planar portions of the label together, where the small portion is smaller than the two planar portions. A cutout of a label can include a hole placed through a thermal conduction layer of a label. The shape (e.g., square, circle, etc.) of a cutout can vary between embodiments. A rib of a label can include a fin (e.g., vertical fin), a three-dimensional element (e.g., rectangular box or rounded protrusion), or the like disposed on a surface of a thermal conduction layer of a label. An example rib can be constructed of metal (e.g., copper or the like) similar to that of the thermal conduction layer.

Disclosed herein are some examples of PCBs that include or use a circuit label configured for thermal conductivity, which can be used with a PCB implementing a memory sub-system, as described herein.

FIG. 1 illustrates an example of a thermally conductive label attached to a PCB 116, in accordance with some embodiments of the present disclosure. In particular, view 100A presents a top profile view of the label as attached to the PCB 116, and view 100B presents a side profile view of the label as attached to the PCB 116. As shown, disposed on one side of the PCB 116 are multiple components 114A, 114B, 114C. The PCB 116 can represent a memory sub-system or a memory module, such as a SSD module or a random access memory (RAM) module (e.g., a dual in-line memory module (DIMM)), and each of the components 114A, 114B, 114C can represent memory components of the memory sub-system/the memory module, such as a memory sub-system controller, media controller, or a memory integrated circuit (IC) (e.g., an negative-and (NAND)-type flash memory IC). As shown by view 100A, the label comprises a first planar portion 112A, a second planar portion 112B, and multiple tab portions 110A, 110B that connect together the first planar portion 112A and the second planar portion 112B. As also shown by view 100A, the tab portions 110A, 110B create openings over and along an edge of the PCB 116.

As shown by view 100B, the tab portion 110A (and likewise tab portion 110B, though not shown) is configured such that it can pass over (e.g., curve or bend around) an edge of the PCB 116. Additionally, the first planar portion 112A is attached over (e.g., to a top surface of) the component 114A (and likewise components 114B and 114C, though not shown), and the second planar portion 112B is attached over (e.g., to a top surface of) the other side of the PCB 116. Though not shown, the first planar portion 112A can be attached to the PCB 116 by way of a first adhesive layer, and the second planar portion 112B can be attached to the PCB 116 by way of a second adhesive layer, while the tab portions 110A, 110B can exclude an adhesive layer (as these portions do not attach to the PCB 116). One or more of the adhesive layers can comprise a thermally conductive adhesive material, which can reduce or minimize through plane thermal resistance. For instance, the first adhesive layer can comprise a first layer of thermal cure adhesive (which may or may not be conductive), or the second adhesive layer can comprise a second layer of thermal cure adhesive. For some embodiments, an adhesive layer is disposed on one or more of the outer-facing surfaces of the first planar portion 112A, the second planar portion 112B, and the tab portions 110A, 110B. This can enable an additional element to be attached to one or more of the outer-facing surfaces. For instance, a heat sink can be attached to the PCB 116, over the label, which can further improve thermal energy dissipation (e.g., improve convection air flow dissipation/cooling) of the PCB 116.

According to various embodiments, the first planar portion 112A comprises a first thermal conduction layer, the second planar portion 112B comprises a second thermal conduction layer, and each of the tab portions 110A, 110B comprises a separate thermal conduction layer that connects the first thermal conduction layer (of the first planar portion 112A) to the second thermal conduction layer (of the second planar portion 112B). In this way, thermal energy absorbed (e.g., heat generated by and absorbed from the PCB 116) by the first planar portion 112A can travel to the second planar portion 112B through the tab portions 110A, 110B, thereby allowing thermal energy (e.g., heat) to dissipate by way of the surface area of both the first planar portion 112A and the second planar portion 112B. Depending on the embodiment, the first thermal conduction layer can comprise a first metal layer (e.g., first copper layer), and the second thermal conduction layer can comprise a second metal layer (e.g., second copper layer), while each of the separate conductive layers (of the tab portions 110A, 110B) can exclude a metal layer (e.g., to enable the tab portions 110A, 110B to more easily pass (e.g., curve) over the edge of the PCB 116). Depending on the embodiment, one or more of the metal layers can be customized for the PCB 116 to limit through plane heat transfer to specific locations. Additionally, the first thermal conduction layer can comprise a first pyrolytic graphite layer (e.g., with 17 mm thickness and 1750 W/m*K thermal conductivity), the second thermal conduction layer can comprise a second pyrolytic graphite layer, and each separate thermal conduction layer can comprise a separate pyrolytic graphite layer. The first pyrolytic graphite layer (of the first planar portion 112A) can comprise at least one cutout corresponding to at least one of the components 114A, 114B, 114C. Where the first thermal conduction layer (of the first planar portion 112A) comprises a pyrolytic graphite layer, two or more adhesive layers can be used to construct the label. Likewise, where the second thermal conduction layer (of the second planar portion 112B) comprises a pyrolytic graphite layer, two or more adhesive layers can be used to construct the label. By use of two or more adhesive layers, various embodiments can provide higher resistance to conduct heat from the PCB 116.

Either the first planar portion 112A, the second planar portion 112B, or both can include additional features (not shown) to improve/enhance thermal energy dissipation properties of the label. A set of ribs (e.g., 4 mm×1 mm×0.75 mm box) can be disposed on an outer-facing surface of the first thermal conduction layer (of the first planar portion 112A), the second thermal conduction layer (of the second planar portion 112B), or both. Each rib can comprise (e.g., be constructed of) a metal, such as copper. Additionally, the first thermal conduction layer (of the first planar portion 112A), the second thermal conduction layer (of the second planar portion 112B), or both comprise a set of cutouts (e.g., 2 mm×2 mm cutouts).

Figure 2:
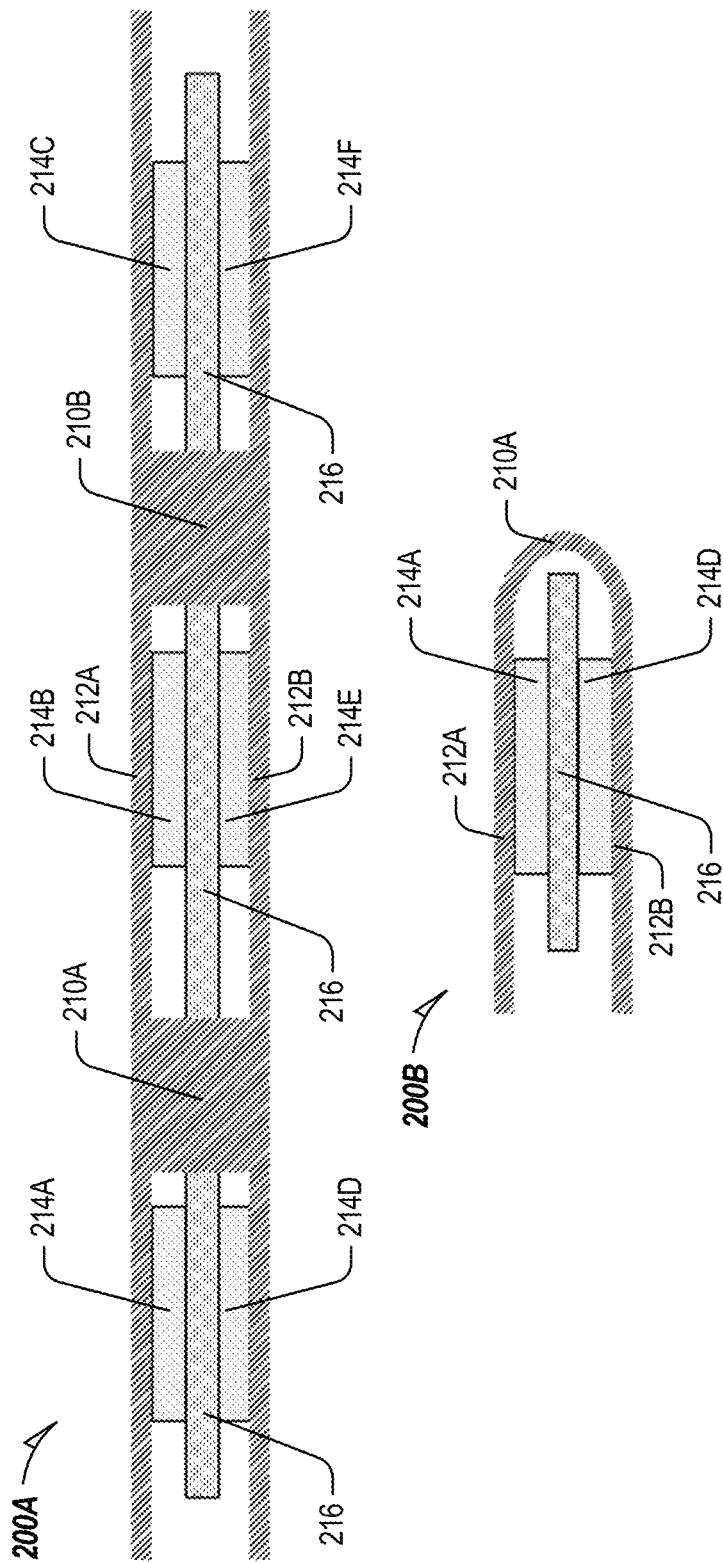

FIG. 2 illustrates an example of a thermally conductive label attached to a PCB 216, in accordance with some embodiments of the present disclosure. In particular, the label of FIG. 2 is similar to the label of FIG. 1, where view 200A presents a top profile view of the label as attached to the PCB 216 and view 200B presents a side profile view of the label as attached to the PCB 216. As shown, disposed on one side of the PCB 216 are multiple components 214A, 214B, 214C, and disposed on the opposite side of the PCB 216 are multiple components 214D, 214E, 214F. Like with FIG. 2, the PCB 216 can represent a memory sub-system or a memory module, and each of the components 214A, 214B, 214C can represent memory components of the memory sub-system/the memory module. As shown by view 200A, the label comprises a first planar portion 212A, a second planar portion 212B, and multiple tab portions 210A, 210B that connect together the first planar portion 212A and the second planar portion 212B. As also shown by view 200A, the tab portions 210A, 210B create openings over and along an edge of the PCB 216.

As shown by view 200B, the tab portion 210A (and likewise tab portion 210B, though not shown) is configured such that it can pass over (e.g., curve or bend around) an edge of the PCB 216. Additionally, the first planar portion 212A is attached over (e.g., to a top surface of) the component 214A (and likewise components 214B and 214C, though not shown), and the second planar portion 212B is attached over (e.g., to a top surface of) the component 214D (and likewise components 214E and 214F, though not shown). Though not shown, the first planar portion 212A can be attached to the PCB 216 by way of a first adhesive layer, and the second planar portion 212B can be attached to the PCB 216 by way of a second adhesive layer, while the tab portions 210A, 210B can exclude an adhesive layer (as it does not attach to the PCB 216). As described herein, one or more of the adhesive layers can comprise a thermally conductive adhesive material, which can minimize through plane thermal resistance. For some embodiments, an adhesive layer is disposed on one or more of the outer-facing surfaces of the first planar portion 212A, the second planar portion 212B, and the tab portions 210A, 210B. As described herein, this can enable an additional element (e.g., heat sink) to be attached to the one or more of the outer-facing surfaces.

Like with FIG. 1, the first planar portion 212A comprises a first thermal conduction layer, the second planar portion 212B comprises a second thermal conduction layer, and each of the tab portions 210A, 210B comprises a separate thermal conduction layer that connects the first thermal conduction layer (of the first planar portion 212A) to the second thermal conduction layer (of the second planar portion 212B). In this way, thermal energy absorbed (e.g., heat generated by and absorbed from the PCB 216) by the first planar portion 212A can travel to the second planar portion 212B through the tab portions 210A, 210B, thereby allowing thermal energy (e.g., heat) to dissipate by way of the surface area of both the first planar portion 212A and the second planar portion 212B. Depending on the embodiment, the first thermal conduction layer can comprise a first metal layer (e.g., first copper layer), and the second thermal conduction layer can comprise a second metal layer (e.g., second copper layer), while each of the separate conductive layers (of the tab portions 210A, 210B) can exclude a metal layer (e.g., to enable the tab portions 210A, 210B to more easily pass over the edge of the PCB 216). Depending on the embodiment, one or more of the metal layers (e.g., copper layers) can be customized for the PCB 116 to limit through plane heat transfer to specific locations. Additionally, the first thermal conduction layer can comprise a first pyrolytic graphite layer, the second thermal conduction layer can comprise a second pyrolytic graphite layer, and each separate thermal conduction layer can comprise a separate pyrolytic graphite layer. The first pyrolytic graphite layer (of the first planar portion 212A) can comprise at least one cutout corresponding to at least one of the components 214A, 214B, 214C, and the second pyrolytic graphite layer (of the first planar portion 212B) can comprise at least one cutout corresponding to at least one of the components 214D, 214E, 214F. As described herein, where the first thermal conduction layer (of the first planar portion 212A) comprises a pyrolytic graphite layer, two or more adhesive layers can be used to construct the label. Likewise, where the second thermal conduction layer (of the second planar portion 212B) comprises a pyrolytic graphite layer, two or more adhesive layers can be used to construct the label. By use of two or more adhesive layers, various embodiments can provide higher resistance to conduct heat from the PCB 216.

Either the first planar portion 212A, the second planar portion 212B, or both can include additional features (not shown) to improve/enhance thermal energy dissipation properties of the label. For instance, at least one of the first planar portion 212A can comprise a first dissipator layer, or the second planar portion 212B can comprise a second dissipator layer. A set of ribs can be disposed on an outer-facing surface of the first thermal conduction layer (of the first planar portion 212A), the second thermal conduction layer (of the second planar portion 212B), or both. Each rib can comprise (e.g., be constructed) of a metal, such as copper. Additionally, the first thermal conduction layer (of the first planar portion 112A), the second thermal conduction layer (of the second planar portion 112B), or both comprise a set of cutouts.

Figure 3:
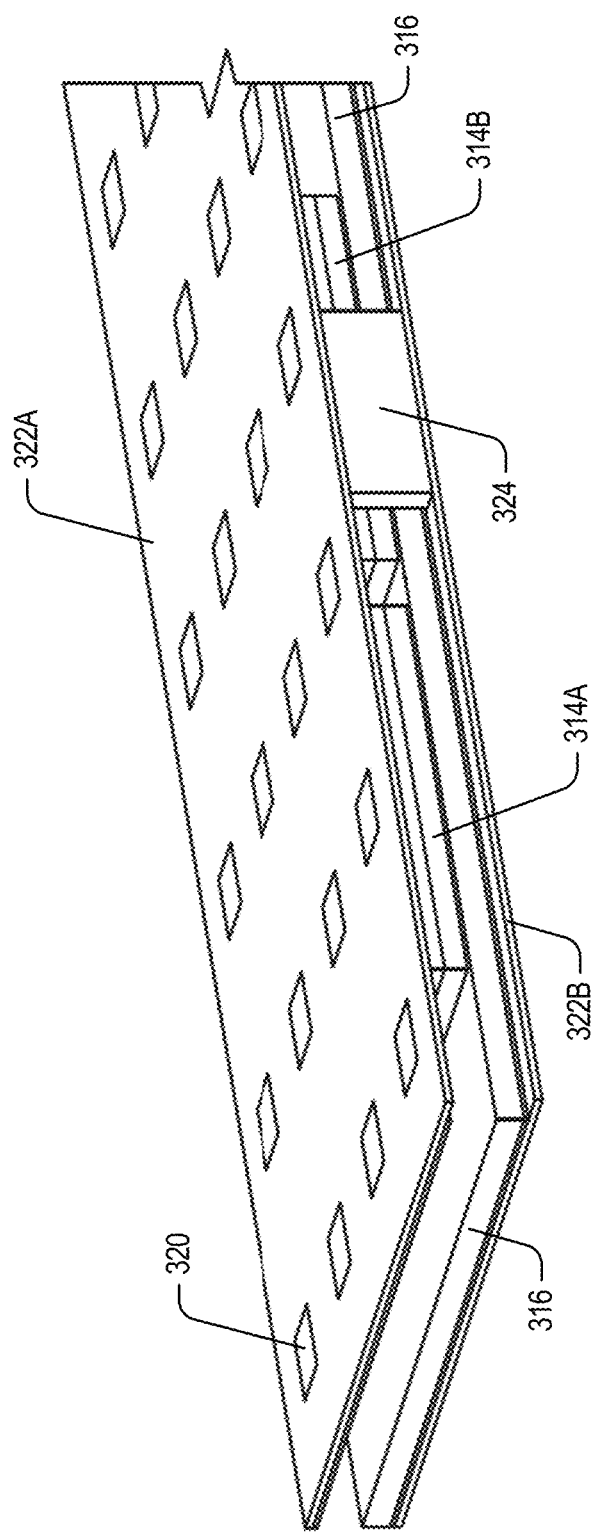
FIG. 3 illustrates an example thermal conductive layer with cutouts of a label attached to a PCB, in accordance with some embodiments of the present disclosure.

FIG. 3 illustrates an example thermal conductive layer 322A with cutouts (e.g., 320) of a label attached to a PCB 316, in accordance with some embodiments of the present disclosure. In FIG. 3, the label comprises a first planar portion comprising a first thermal conduction layer 322A, a second planar portion comprising a second thermal conduction layer 322B, and a tab portion comprising a thermal conduction layer 324 (the tab portion connecting the first planar portion and the second planar portion). According to various embodiments, the thermal conduction layer 324 connects the first thermal conduction layer 322A (of the first planar portion) to the second thermal conduction layer 322B (of the second planar portion). Thermal energy absorbed (e.g., heat generated by and absorbed from the PCB 316) by the first planar portion (via the first thermal conduction layer 322A) can travel to the second planar portion through the tab portion via the thermal conduction layer 324, thereby allowing thermal energy (e.g., heat) to dissipate by way of the surface area of both the first planar portion and the second planar portion.

As shown, the first thermal conduction layer 322A comprises multiple cutouts 320, which can further assist in dissipation of thermal energy generated by the PCB 316 and its various components 314A, 314B. For some embodiments, the second thermal conduction layer 322B comprises one or more similar cutouts 320. As also shown, the thermal conduction layer 324 connects the first thermal conduction layer 322A and the second thermal conduction layer 322B over an edge of the PCB 316. The first planar portion is attached over (e.g., to a top surface of) the component 314A and component 314B, and the second planar portion is attached over (e.g., to a top surface of) the other side of the PCB 316. Though not shown, the first planar portion can be attached to the PCB 316 by way of a first adhesive layer, and the second planar portion can be attached to the PCB 316 by way of a second adhesive layer, while the tab portion can exclude an adhesive layer (as it does not attach to the PCB 316). To further improve thermal energy dissipation, for some embodiments, cutouts (e.g., 320) can be used in combination with one or more ribs disposed on the surface of one or more of the thermal conduction layers as described herein.

Figure 4:
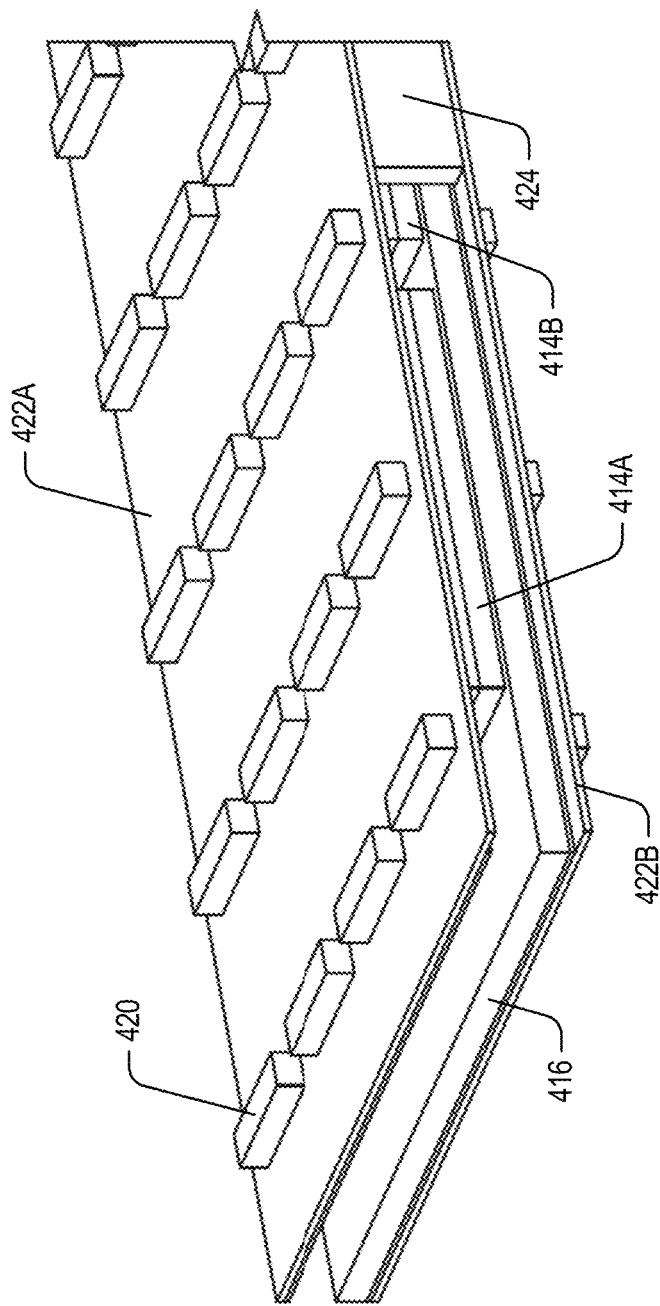
FIG. 4 illustrates an example thermal conductive layer with ribs on a label attached to a PCB, in accordance with some embodiments of the present disclosure.

FIG. 4 illustrates an example thermal conductive layer 422A with ribs (e.g., 420) of a label attached to a PCB 416, in accordance with some embodiments of the present disclosure. In FIG. 4, the label comprises a first planar portion comprising a first thermal conduction layer 422A, a second planar portion comprising a second thermal conduction layer 422B, and a tab portion comprising a thermal conduction layer 424 (the tab portion connecting the first planar portion and the second planar portion). According to various embodiments, the thermal conduction layer 424 connects the first thermal conduction layer 422A (of the first planar portion) to the second thermal conduction layer 422B (of the second planar portion). Thermal energy absorbed by the first planar portion (via the first thermal conduction layer 422A) can travel to the second planar portion through the tab portion via the thermal conduction layer 424, thereby allowing thermal energy (e.g., heat) to dissipate by way of the surface area of both the first planar portion and the second planar portion.

As shown, multiple ribs 420 are disposed on the outer-facing surface of the first thermal conduction layer 422A, which can further assist in dissipation of thermal energy absorbed by the first planar portion from the PCB 416 and its various components 414A, 414B. For some embodiments, one or more ribs 420 can be disposed on the outer-facing surface of the second thermal conduction layer 422B. As also shown, the thermal conduction layer 424 connects the first thermal conduction layer 422A and the second thermal conduction layer 422B over an edge of the PCB 416. The first planar portion is attached over (e.g., to a top surface of) the component 414A and component 414B, and the second planar portion is attached over (e.g., to a top surface of) the other side of the PCB 416. Though not shown, the first planar portion can be attached to the PCB 416 by way of a first adhesive layer, and the second planar portion can be attached to the PCB 416 by way of a second adhesive layer, while the tab portion can exclude an adhesive layer (as it does not attach to the PCB 416). To further improve thermal energy dissipation, for some embodiments, ribs (e.g., 420) can be used in combination with one or more cutouts of one or more of the thermal conduction layers as described herein.

Figure 5:
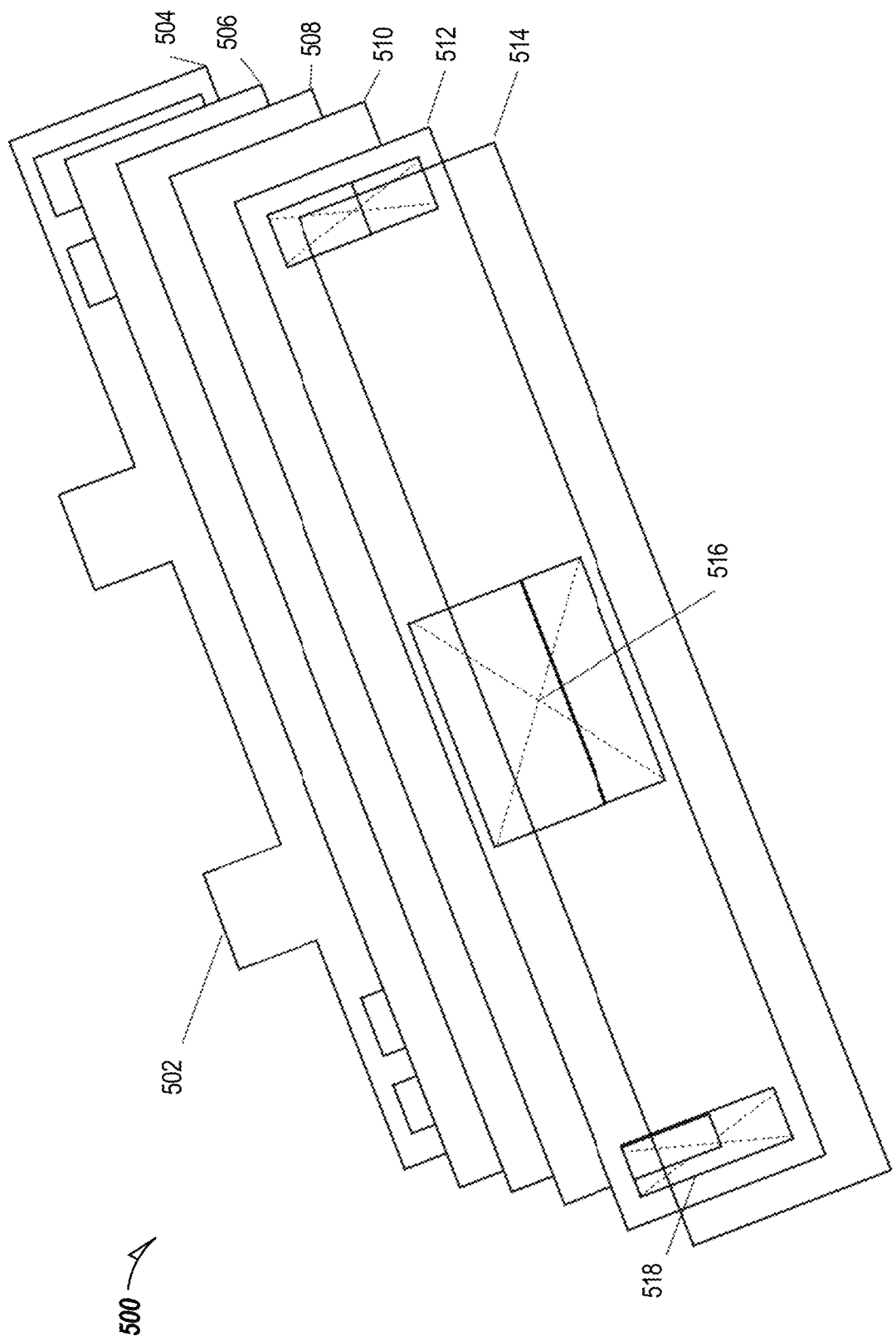
FIG. 5 illustrates an example construction of a thermal conductive label, in accordance with some embodiments of the present disclosure.

FIG. 5 illustrates an example construction 500 of a thermal conductive label, in accordance with some embodiments of the present disclosure. In FIG. 5, the construction 500 comprises two tab portions 502 that connect the two planar portions of the label together. The construction 500 comprises two pyrolytic graphite layers 504, 512 (e.g., each comprising a 25 um pyrolytic graphite sheet). The construction 500 comprises adhesive layers 506, 510, 514 (e.g., each comprising 0.0005 in of HERNON DISSIPATOR 745 with EF ACTIVATOR 63). The construction 500 comprises a metal layer 508 (e.g., 200 um copper layer). As shown, the pyrolytic graphite layer 512 includes cutouts 516, 518 for components or transfer posts disposed on a PCB.

Figure 6:
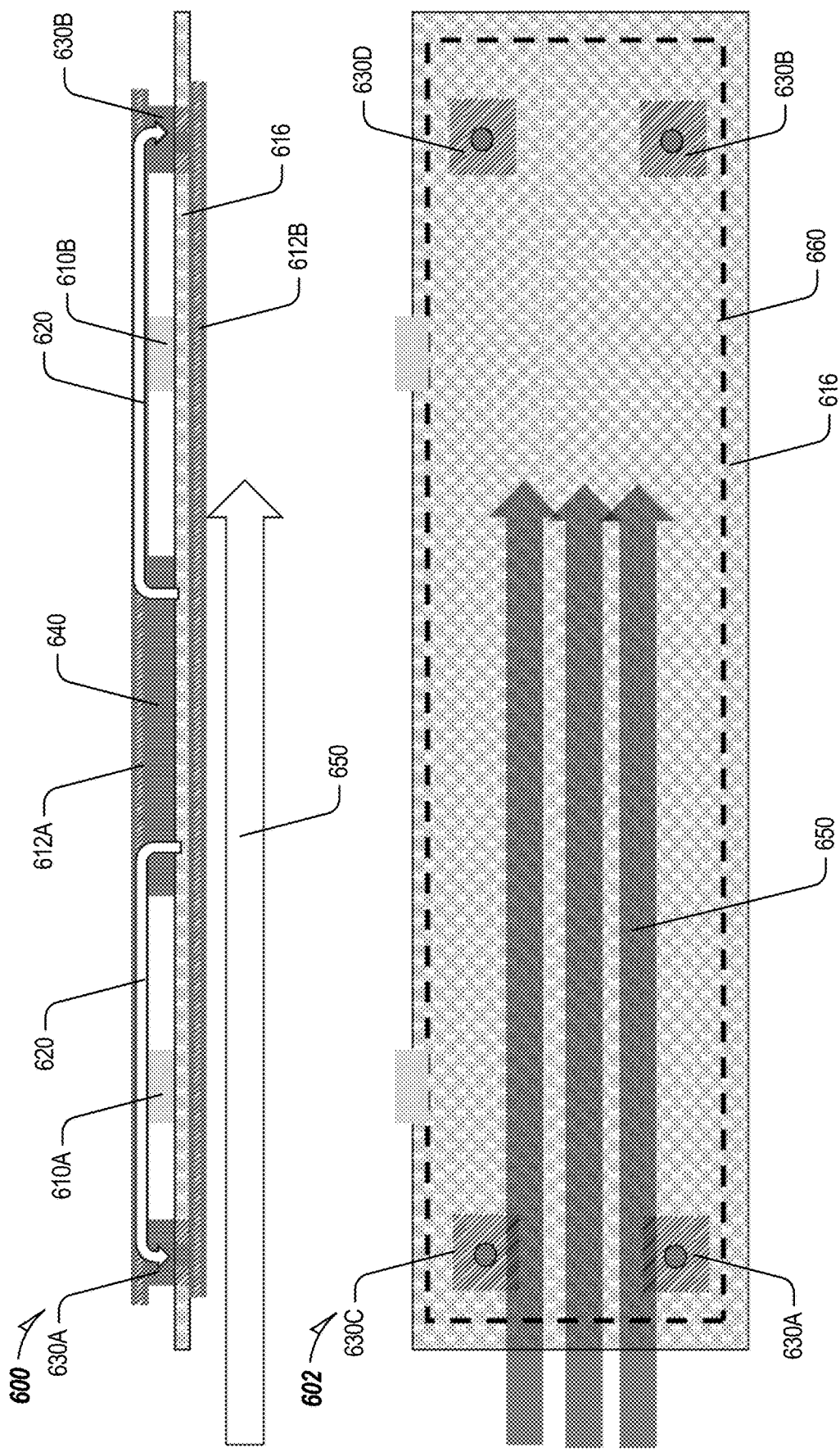
FIG. 6 illustrates an example of thermal conduction through a thermally conductive label, in accordance with some embodiments of the present disclosure.

FIG. 6 illustrates an example of thermal conduction through a thermally conductive label, in accordance with some embodiments of the present disclosure. In particular, view 600 presents a bottom profile view of the label as attached to a PCB 616, and view 602 presents a top cross section view of the label as attached to a PCB 616. The label comprises a first planar portion 612A, a second planar portion 612B, and multiple tab portions 610A, 610B that connect together the first planar portion 612A and the second planar portion 612B. A component 640 is disposed on a surface of the PCB 616. The PCB 616 comprises transfer posts 630A, 630B, 630C, 630D. During operation of the PCB 616, the thermal energy generated by the PCB 616 and the component 640 flows through the first planar portion 612A and down the transfer posts 630A, 630B, 630C, 630D, as illustrated by thermal conduction path 620. In an environment that provides convection air cooling (e.g., fan-based cooling or natural convection), a convection air flow 650 can cool the thermal energy absorbed by the first planar portion 612A and the second planar portion 612B. In view 602, an outline 660 represents an outline of the first planar portion 612A and the second planar portion 612B over the PCB 616.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory module comprising:
   a printed circuit board having a first side and a second side;
   a set of memory components disposed on the first side; and
   a label attached to the printed circuit board, the label comprising:
   a first planar portion comprising a first thermal conduction layer, the first thermal conduction layer comprising:
   a first pyrolytic graphite layer;
   a first metal layer;
   a first adhesive layer that attaches the first pyrolytic graphite layer to the first metal layer;
   a second pyrolytic graphite layer that comprises at least one cutout corresponding to at least one memory component in the set of memory components;
   a second adhesive layer that attaches the second pyrolytic graphite layer to the first metal layer; and
   a third adhesive layer that attaches the second pyrolytic graphite layer to the printed circuit board such that the first planar portion is disposed over the set of memory components on the first side;
   a set of three-dimensional protrusions being disposed on a first outer-facing surface of the first thermal conduction layer, each three-dimensional protrusion of the set of three-dimensional protrusions being configured to dissipate thermal energy absorbed by the first planar portion from the printed circuit board, at least one three-dimensional protrusion in the set of three-dimensional protrusions being a rectangular box;
   a second planar portion comprising a second thermal conduction layer;
   a fourth adhesive layer that attaches the second planar portion to the printed circuit board such that the second planar portion is disposed over the second side of the printed circuit board; and
   a plurality of tab portions in which each tab portion connects the first planar portion to the second planar portion, each tab portion passes over a single edge of the printed circuit board, and each tab portion comprises a separate thermal conduction layer that connects the first thermal conduction layer to the second thermal conduction layer.

2. The memory module of claim 1, wherein the second thermal conduction layer comprises a third pyrolytic graphite layer, and the third pyrolytic graphite layer is separate from the first and second pyrolytic graphite layers.

3. The memory module of claim 2, wherein the third pyrolytic graphite layer comprises at least one cutout corresponding to at least another memory component in a second set of memory components.

4. The memory module of claim 1, wherein the second thermal conduction layer comprises a second metal layer, and the second metal layer is separate from the first metal layer.

5. The memory module of claim 1, wherein the set of three-dimensional protrusions is a first set of three-dimensional protrusions and the label comprises:
   a second set of three-dimensional protrusions disposed on a second outer-facing surface of the second thermal conduction layer, each three-dimensional protrusion of the second set of three-dimensional protrusions being configured to dissipate thermal energy absorbed by the second planar portion from the printed circuit board.

6. The memory module of claim 5, wherein at least one in the second set of three-dimensional protrusions is a rectangular box.

7. The memory module of claim 1, wherein the second thermal conduction layer comprises a second set of cutouts.

8. A memory module comprising:
a printed circuit board having a first side and a second side;
a first set of memory components disposed on the first side;
a second set of memory components disposed on the second side; and
a label attached to the printed circuit board, the label comprising:
a first planar portion comprising a first thermal conduction layer, the first thermal conduction layer comprising:
a first pyrolytic graphite layer;
a first metal layer;
a first adhesive layer that attaches the first pyrolytic graphite layer to the first metal layer;
a second pyrolytic graphite layer that comprises at least one cutout corresponding to at least one memory component in the first set of memory components;
a second adhesive layer that attaches the second pyrolytic graphite layer to the first metal layer; and
a third adhesive layer that attaches the second pyrolytic graphite layer to the printed circuit board such that the first planar portion is disposed over the first set of memory components on the first side;
a set of three-dimensional protrusions being disposed on a first outer-facing surface of the first thermal conduction layer, each three-dimensional protrusion of the set of three-dimensional protrusions being configured to dissipate thermal energy absorbed by the first planar portion from the printed circuit board, at least one three-dimensional protrusion in the set of three-dimensional protrusions being a rectangular box;
a second planar portion comprising a second thermal conduction layer;
a fourth adhesive layer that attaches the second planar portion to the printed circuit board such that the second planar portion is disposed over the second set of memory components on the second side; and
a plurality of tab portions in which each tab portion connects the first planar portion to the second planar portion, each tab portion passes over a single edge of the printed circuit board, and each tab portion comprises a separate thermal conduction layer that connects the first thermal conduction layer to the second thermal conduction layer.

9. The memory module of claim 8, wherein the second thermal conduction layer comprises a third pyrolytic graphite layer, and the third pyrolytic graphite layer is separate from the first and second pyrolytic graphite layers.

10. The memory module of claim 9, wherein the third pyrolytic graphite layer comprises at least one cutout corresponding to at least another memory component in the second set of memory components.

11. The memory module of claim 8, wherein the second thermal conduction layer comprises a second metal layer, and the second metal layer is separate from the first metal layer.

12. The memory module of claim 8, wherein the set of three-dimensional protrusions is a first set of three-dimensional protrusions and the label comprises:
a second set of three-dimensional protrusions disposed on a second outer-facing surface of the second thermal conduction layer, each three-dimensional protrusion of the second set of three-dimensional protrusions being configured to dissipate thermal energy absorbed by the second planar portion from the printed circuit board.

13. The memory module of claim 12, wherein at least one in the second set of three-dimensional protrusions is a rectangular box.

14. The memory module of claim 8, wherein the first thermal conduction layer comprises a first set of cutouts, and the second thermal conduction layer comprises a second set of cutouts.

15. A label comprising:
a first planar portion comprising a first thermal conduction layer, the first thermal conduction layer comprising:
a first pyrolytic graphite layer;
a first metal layer;
a first adhesive layer that attaches the first pyrolytic graphite layer to the first metal layer;
a second pyrolytic graphite layer that comprises at least one cutout corresponding to at least one memory component in a set of memory components;
a second adhesive layer that attaches the second pyrolytic graphite layer to the first metal layer; and
a third adhesive layer that attaches the second pyrolytic graphite layer to a printed circuit board such that the first planar portion is disposed over the set of memory components;
a set of three-dimensional protrusions being disposed on a first outer-facing surface of the first thermal conduction layer, each three-dimensional protrusion of the set of three-dimensional protrusions being configured to dissipate thermal energy absorbed by the first planar portion from the printed circuit board, at least one three-dimensional protrusion in the set of three-dimensional protrusions being a rectangular box;
a second planar portion comprising a second thermal conduction layer;
a fourth adhesive layer configured to attach the second planar portion to the printed circuit board such that the second planar portion is disposed over a second side of the printed circuit board; and
a plurality of tab portions in which each tab portion connects the first planar portion to the second planar portion, each tab portion is configured to pass over a single edge of the printed circuit board, and each tab portion comprises a separate thermal conduction layer that connects the first thermal conduction layer to the second thermal conduction layer.

16. The label of claim 15, wherein the set of three-dimensional protrusions is a first set of protrusions, the label comprising:
a second set of three-dimensional protrusions disposed on a second outer-facing surface of the second thermal conduction layer, each three-dimensional protrusion of the second set of three-dimensional protrusions being configured to dissipate thermal energy absorbed by the second planar portion from the printed circuit board.

17. The label of claim 15, wherein the second thermal conduction layer comprises a second set of cutouts.

\* \* \* \* \*